United States Patent
Daiber

(10) Patent No.: US 6,724,797 B2
(45) Date of Patent: Apr. 20, 2004

(54) EXTERNAL CAVITY LASER WITH SELECTIVE THERMAL CONTROL

(75) Inventor: Andrew Daiber, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/900,429

(22) Filed: Jul. 6, 2001

(65) Prior Publication Data

US 2003/0007540 A1 Jan. 9, 2003

(51) Int. Cl.$^7$ .................................................. H01S 3/08
(52) U.S. Cl. ..................... 372/92; 372/100; 372/102; 372/105; 372/108
(58) Field of Search ...................... 372/92, 100, 102, 372/105, 108

(56) References Cited

U.S. PATENT DOCUMENTS

| | | |
|---|---|---|
| 3,967,211 A | 6/1976 | Itzkan et al. |
| 4,309,671 A | 1/1982 | Malyon |
| 4,504,950 A | 3/1985 | AuYeung |

(List continued on next page.)

FOREIGN PATENT DOCUMENTS

| | | |
|---|---|---|
| EP | 0 849 846 A2 | 6/1998 |
| EP | 0924628 | 8/1998 |
| WO | WO 98/44424 | 10/1998 |
| WO | WO 00/49689 | 8/2000 |
| WO | PCT/US 02/21414 | 10/2003 |

OTHER PUBLICATIONS

Favre et al.:'External–Cavity Semiconductor Laser With 15 nm Continuous Tuning Range', Electronics Letters Jun. 19, 1986.
Macleod, H. A. in *Thin Film Optical Filters* 2$^{nd}$ Edition, McGraw–Hill, 1989, pp. 244–269.
Mellis et al.: 'Miniature Packaged External–Cavity Semiconductor Laser With 50Ghz Continuous Electical Tuning Range', Electronics Letters Apr. 22, 1988.
Rosenberg, K. P., et al., "Logarithmically Variable Infrared Etalon Filters," SPIE, vol. 2262/223, pp. 223–232.
Scobey M. and Stupik P., "Stable Ultra–Narrow Bandpass Filters," SPIE, vol. 2262, pp. 37–46.
Siegman A. E., "An Introduction to Lasers and Masers," McGraw–Hill, Inc., 1971.
Takashashi, H., Temperature Stability of Thin–Film Narrow–Bandpass Filters Produced by Ion–Assisted Deposition Applied Optics vol. 34, No. 4, Feb. 1, 1995.
Yoder, *Optical Instrument Structural Design*, pp. 612–619.
Zhang, X.X., "An Interference Filter Based External Cavity Laser For Dense Wavelength Division Multiplexing Applications," Corning OCA Corp., pp. 103–108.
Ichihashi, Yasutaka et al., "130 GHz Frequency Sweep Over a 30nm Tuning Range without Mode Hopping by an External–Cavity Semiconductor Laser", IEICE Transactions on Communications, Institute of Electronics Information and Comm. Eng., Tokyo, JP, vol. E75–B, No. 6, Jun. 1992, pp. 521–523.
Andalkar, A. et al., "Improved External Cavity Design for Cesium D1 (894 nm) Diode Laser", Review of Scientific Instruments, American Institute of Physics. New York, US., vol. 71, No. 11, Nov. 2000, pp. 4029–4031.

*Primary Examiner*—Paul Ip
*Assistant Examiner*—Cornelius H Jackson
(74) *Attorney, Agent, or Firm*—Blakely, Sokoloff, Taylor & Zafman LLP

(57) ABSTRACT

A laser apparatus wherein a gain medium and an optical output assembly are mounted on a common, thermally conductive substrate which provides selective thermal control of the gain medium and output components on the substrate while avoiding unnecessary thermal control of other laser components, and methods for selectively cooling a gain medium and output components of a laser apparatus.

29 Claims, 6 Drawing Sheets

U.S. PATENT DOCUMENTS

| | | |
|---|---|---|
| 4,560,246 A | 12/1985 | Cotter |
| 4,583,227 A | 4/1986 | Kirkby |
| 4,770,047 A | 9/1988 | Arditty et al. |
| 4,839,614 A | 6/1989 | Hill et al. |
| 4,843,233 A | 6/1989 | Jeunhomme |
| 4,870,269 A | 9/1989 | Jeunhomme |
| 4,932,782 A | 6/1990 | Graindorge et al. |
| 4,994,677 A | 2/1991 | Graindorge |
| 5,028,395 A | 7/1991 | Sebille et al. |
| 5,058,124 A | 10/1991 | Cameron et al. |
| 5,103,457 A | 4/1992 | Wallace et al. |
| 5,115,677 A | 5/1992 | Martin et al. |
| 5,141,316 A | 8/1992 | Lefevre et al. |
| 5,172,185 A | 12/1992 | Leuchs et al. |
| 5,181,078 A | 1/1993 | Lefevre et al. |
| 5,185,643 A | 2/1993 | Vry et al. |
| 5,225,930 A | 7/1993 | Land et al. |
| 5,270,791 A | 12/1993 | Lefevre et al. |
| 5,305,330 A | 4/1994 | Rieder et al. |
| 5,319,668 A | 6/1994 | Luecke |
| 5,321,717 A | 6/1994 | Adachi et al. |
| 5,331,651 A | 7/1994 | Becker et al. |
| 5,347,527 A | 9/1994 | Favre et al. |
| 5,349,439 A | 9/1994 | Graindorge et al. |
| 5,349,440 A | 9/1994 | DeGroot |
| 5,373,515 A | 12/1994 | Wakabayashi et al. |
| 5,387,974 A | 2/1995 | Nakatani |
| 5,412,474 A | 5/1995 | Reasenberg et al. |
| 5,420,687 A | 5/1995 | Kachanov |
| 5,428,700 A | 6/1995 | Hall |
| 5,438,579 A | 8/1995 | Eda et al. |
| 5,450,202 A | 9/1995 | Tisue |
| 5,473,625 A | 12/1995 | Hansen et al. |
| 5,543,916 A | 8/1996 | Kachanov |
| 5,583,638 A | 12/1996 | Cutler |
| 5,594,744 A | 1/1997 | Lefevre et al. |
| 5,606,439 A | 2/1997 | Wu |
| 5,631,736 A | 5/1997 | Thiel et al. |
| 5,712,704 A | 1/1998 | Martin et al. |
| 5,719,674 A | 2/1998 | Martin et al. |
| 5,737,109 A | 4/1998 | Goodwin |
| 5,760,391 A | 6/1998 | Narendran |
| 5,802,085 A | 9/1998 | Lefevre et al. |
| 5,825,792 A | 10/1998 | Villeneuve et al. |
| 5,886,785 A | 3/1999 | Lefevre et al. |
| 5,943,352 A * | 8/1999 | Fee .................. 372/32 |
| 5,946,331 A | 8/1999 | Amersfoort et al. |
| 5,991,061 A | 11/1999 | Adams et al. |
| 6,061,369 A | 5/2000 | Conradi |
| 6,084,695 A | 7/2000 | Martin et al. |
| 6,108,355 A | 8/2000 | Zorabedian |
| RE37,044 E | 2/2001 | Wu |
| 6,192,058 B1 | 2/2001 | Abeles |
| 6,205,159 B1 | 3/2001 | Sesko et al. |
| 6,246,480 B1 | 6/2001 | O'Brien |
| 6,249,364 B1 | 6/2001 | Martin et al. |
| 6,252,718 B1 | 6/2001 | Lefevre |
| 6,282,215 B1 | 8/2001 | Zorabedian et al. |
| 6,304,586 B1 * | 10/2001 | Pease et al. ............. 372/38.02 |
| 6,330,253 B1 | 12/2001 | Tuganov et al. |
| 6,331,892 B1 | 12/2001 | Green |

\* cited by examiner

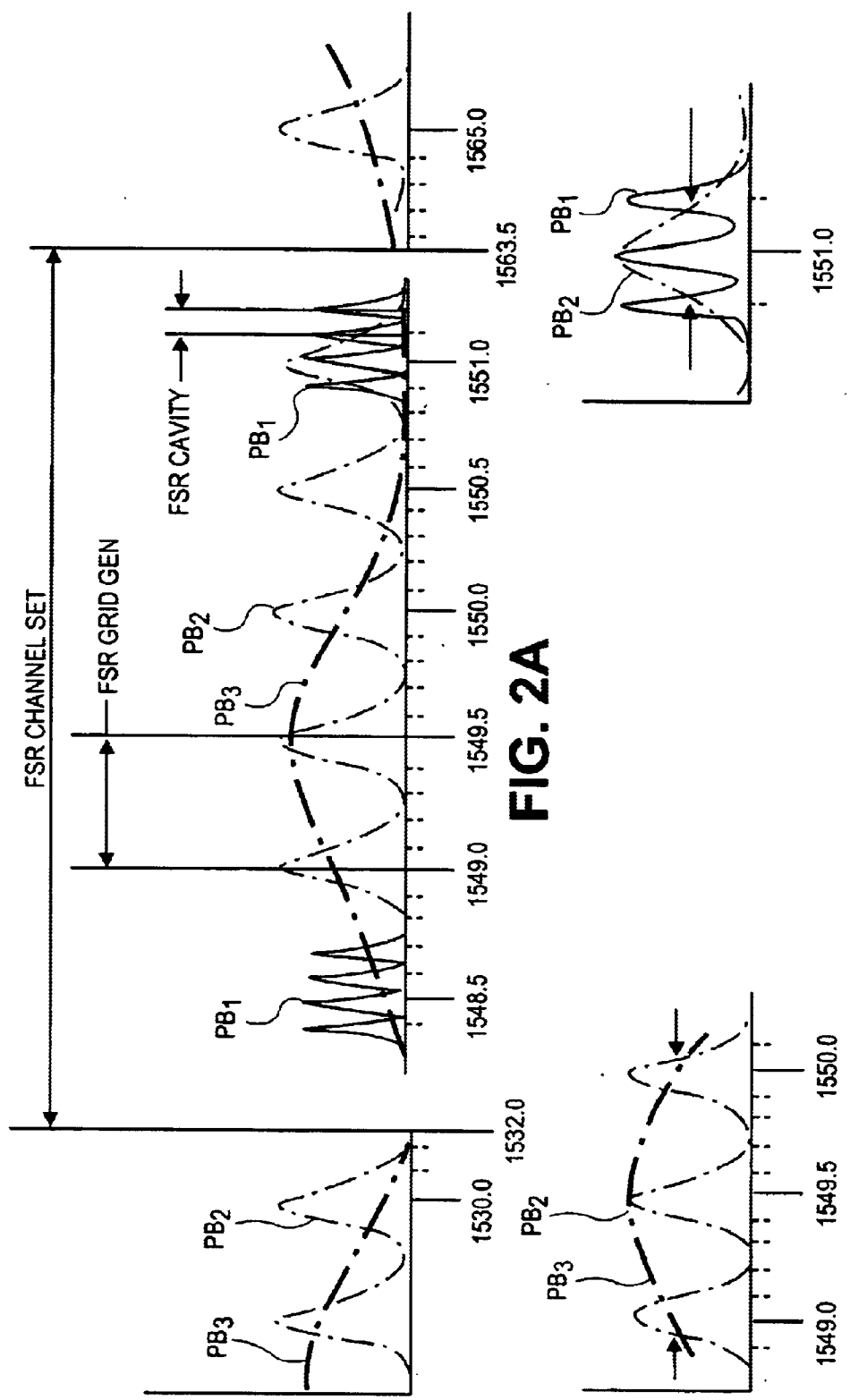

000
EXTERNAL CAVITY LASER WITH SELECTIVE THERMAL CONTROL

BACKGROUND OF THE INVENTION

Fiberoptic telecommunication systems are continually subject to demand for increased bandwidth. One way that bandwidth expansion has been accomplished is through dense wavelength division multiplexing (DWDM) wherein multiple separate data streams exist concurrently in a single optical fiber, with modulation of each data stream occurring on a different channel. Each data stream is modulated onto the output beam of a corresponding semiconductor transmitter laser operating at a specific channel wavelength, and the modulated outputs from the semiconductor lasers are combined onto a single fiber for transmission in their respective channels. The International Telecommunications Union (ITU) presently requires channel separations of approximately 0.4 nanometers, or about 50 GHz. This channel separation allows up to 128 channels to be carried by a single fiber within the bandwidth range of currently available fibers and fiber amplifiers. Improvements in fiber technology together with the ever-increasing demand for greater bandwidth will likely result in smaller channel separation in the future.

Transmitter lasers used in DWDM systems have typically been based on distributed feedback (DFB) lasers operating with a reference etalon associated in a feedback control loop, with the reference etalon defining the ITU wavelength grid. Statistical variation associated with the manufacture of individual DFB lasers results in a distribution of channel center wavelengths across the wavelength grid, and thus individual DFB transmitters are usable only for a single channel or a small number of adjacent channels. Continuously tunable external cavity lasers have been developed to overcome this problem.

The advent of continuously tunable telecommunication lasers has introduced additional complexity to telecommunication transmission systems. In most telecommunication laser transmitters, the entire laser transmitter device is mounted on a single, common, high thermal conductivity substrate or platform, which is subject to thermal control with one or more TECs (thermoelectric controllers). Temperature control allows for maintenance of thermal alignment of all components. Without thermal control, spatial mis-alignment of optical components may arise, to due expansions and contractions associated with the various components, which will reduce wavelength stability, laser output power, and generally reduce the performance of the laser.

The application of thermal control to every component in a laser transmitter is often non-optimal. Indiscriminate thermal control of all components requires a substantial amount of power to provide cooling to the entire assembly, and unnecessarily increases laser operating cost due to power consumption. Indiscriminate thermal control can also result in introduction of thermal dissipation problems in the environment surrounding the laser. In many laser configurations, certain laser components are less susceptible to thermal mis-alignment, or are not susceptible to thermal mis-alignment problems, and providing thermal control to such components results in unnecessary power consumption. Heretofore, no laser systems have been available which provide selective thermal control for important optical components. This lack has resulted in increased operation costs and improved performance for such lasers.

SUMMARY OF THE INVENTION

The present invention relates to external cavity laser devices and methods wherein selective thermal control is applied to optical components having a greater susceptibility to thermal mis-alignment, and wherein unnecessary thermal control of other laser components is avoided. The apparatus of the invention comprises an optical output module for thermally controlling a gain medium and selected optical output components on a common, thermally controlled substrate or base. The methods of the invention comprise selectively cooling a gain medium and selected optical output components of an external cavity laser apparatus on a common, thermally controlled substrate or base.

The apparatus of the invention is configured so that thermal control of only the most alignment-sensitive components of an external cavity laser is required. Thus, the laser device and the cooling system can be configured to provide thermal control to only the most important, alignment- and temperature-sensitive elements of the external cavity laser. The portions that are not temperature sensitive are separately mounted on a different substrate or substrates that are remote or thermally isolated from the temperature controlled substrate. The external cavity laser may be tunable by various mechanisms to allow transmission at multiple selectable wavelength channels. Unnecessary thermal control of tuning mechanism components is avoided by the invention.

The external cavity laser of the invention may comprise a gain medium having first and second output facets, and an end mirror. The gain medium emits a first coherent beam from the first output facet along a first optical path, and a second coherent beam from the second output facet along a second optical path. The end mirror is positioned in the first optical path and is optically coupled to the first output facet of the gain medium. An optical output assembly or module may be positioned in the second optical path and optically coupled to the second output facet of the gain medium. The end mirror and the second output facet define an external cavity, such that the gain medium is within the external cavity and subject to receiving optical feedback from the external cavity.

A thermally conductive substrate is provided in which the gain medium and the optical output assembly are mounted. The thermally conductive substrate is engineered to have high thermal conductivity and a coefficient of thermal expansion that is matched to that of the gain medium. The gain medium and the components of the optical output assembly are temperature sensitive components, and mounting of these components on a common substrate having a high coefficient of thermal conductivity allows for selective and accurate temperature control and cooling of the components of the output assembly.

A thermoelectric controller (TEC) may be joined or coupled to the thermally conductive substrate that provides thermal control for the thermally conductive substrate. The gain medium and optical output assembly are configured to be thermally coupled to, and thermally controlled by, the thermoelectric controller via thermal conduction through the substrate. The thermoelectric controller of the present invention allows for the gain medium and the output assembly to be thermally controlled independently from the end mirror and other components of the external cavity laser.

Temperature monitoring of the thermally conductive substrate is provided by a thermistor that is operatively coupled to the thermoelectric controller and to the thermally conductive substrate, thus allowing the thermistor to detect temperature changes in the substrate (and hence the thermally coupled gain medium and optical output assembly). If any temperature deviation from the optimum temperature is detected, the thermistor signals the thermoelectric controller to adjust the temperature of the substrate so as to maintain a selectable optimal temperature.

The end mirror of the external cavity laser may be mounted on a second substrate that is thermally isolated from the thermoelectric controller. In certain embodiments, the end mirror and other components associated with the external cavity may be mounted together on the second substrate or on a plurality of substrates which are distinct or remote from, or otherwise thermally isolated with respect to the thermally conductive substrate supporting the gain medium and the optical output module.

A first collimating lens may be included on the substrate, and positioned in the first optical path to collimate the coherent beam emitted along the first optical path towards the end mirror. The optical output assembly may comprise a second collimating lens optically coupled to the second output facet of the gain medium, with the second collimating lens positioned in the second optical path proximate to the second output facet of the gain medium. The second collimating lens of the optical output assembly, like the gain medium and first collimating lens, is also mounted on the thermally conductive substrate and configured to be thermally controlled by the thermoelectric controller via thermal conduction through the substrate.

The optical output assembly may also comprise a fiber focusing lens positioned in the second optical path and operatively coupled to an optical fiber. The optical output assembly may also comprise an optical isolator that is positioned in the second optical path and optically coupled to the second collimating lens. In some embodiments, the optical isolator is positioned in the second optical path after the second collimating lens and before the fiber focusing lens, such that the fiber focusing lens is optically coupled to the optical isolator. The optical isolator, which provides unidirectional transmission of light from the gain medium to the fiber, is not particularly alignment sensitive but, due to its location adjacent to the alignment collimating lens and fiber focusing lens, may conveniently be located on the thermally controlled substrate.

Components of the external cavity laser which are remote from or otherwise thermally isolated from the thermally conductive substrate and its temperature controller may comprise, for example, a channel selector and a tuning assembly. The channel selector, which may comprise a wedge etalon, grating, electro-optic etalon, graded filter or other wavelength tuning device, may be positioned in the first optical path between the first output facet of the gain medium and the end mirror. The tuning assembly is operatively coupled to the channel selector and configured to adjust the channel selector via translational and/or rotational positional adjustment, voltage adjustment, or other form of tuning adjustment. The tuning assembly may comprise, for example, a stepper motor configured to positionally adjust a wedge etalon in the first optical path. The channel selector and the tuning assembly are positioned such that the thermally conductive substrate and gain medium and optical output assembly thereon are subject thermal control that it is independent or substantially independent from any thermal characteristics or thermal control associated with the channel selector and tuning assembly. In other words, the channel selector and the tuning assembly are thermally isolated from the thermally conductive substrate and the thermoelectric controller and are positioned remotely from the thermally conductive substrate.

In certain embodiments, the optical output assembly may include a coarse spectrometer that is usable for evaluating the output wavelength of the external cavity laser along the second optical path. The coarse spectrometer is mounted on the thermally conductive substrate and thermally coupled to the TEC. The coarse spectrometer may be positioned in the second optical path after the second collimating lens and before the optical isolator, or after the optical isolator and before the fiber focusing lens.

In an alternative embodiment, the optical output assembly may comprise a grid etalon wherein the grid etalon is mounted on the thermally conductive substrate and thermally coupled to the TEC therethrough. The grid etalon may be positioned in the second optical path after the second collimating lens and before the optical isolator, or after the optical isolator and before the fiber focusing lens.

Temperature sensitive elements which may be subject to selective thermal control on a single thermally conductive substrate in accordance with the present invention include, without limitation; the gain medium, the output coupling optics (collimating lenses), and the grid etalon (etalon). The grid etalon, while temperature sensitive, may in some embodiments be subject to independent temperature control on a separate substrate.

The invention may be embodied in a laser apparatus comprising a optical output module which itself comprises a gain medium and an optical output assembly mounted on a common, thermally conductive substrate and thermally coupled to a thermoelectric controller or other temperature control source. The optical output assembly may vary in configuration, but will generally be configured such that the optical output components are mounted on a thermally conductive surface to regulate the temperature of alignment sensitive output components.

The present invention also provides methods for selectively cooling an external cavity diode laser apparatus. The methods may comprise providing a gain medium having first and second output facets, an end mirror optically coupled to the first output facet, and a optical output assembly optically coupled to a second output facet, and thermally controlling the gain medium and the optical output assembly independently from the end mirror. Thermally controlling the gain medium and the optical output assembly may comprise mounting the gain medium and optical output assembly on a thermally conductive substrate, and coupling the thermally conductive substrate to a thermoelectric controller.

BRIEF DESCRIPTIONS OF THE DRAWINGS

FIGS. 2A–2C are graphical illustrations of pass band characteristics of the external cavity laser of FIG. 1 for the wedge etalon, grid etalon and external cavity with respect to a selected channel in a wavelength grid.

DETAILED DESCRIPTION OF THE INVENTION

Referring more specifically to the drawings, for illustrative purposes the present invention is embodied in the apparatus and method shown in FIG. 1 through FIG. 6. It will be appreciated that the apparatus may vary as to configuration and as to details of the parts, and that the method may vary as to details and the order of events, without departing from the basic concepts as disclosed herein. The invention is disclosed primarily in terms of use with an external cavity laser. However, it will be readily apparent to those skilled in the art that the invention may be used with other types of lasers and optical systems. It also should be understood that the terminology used herein is for the purpose of describing particular embodiments only, and is not intended to be limiting.

Figure 1:
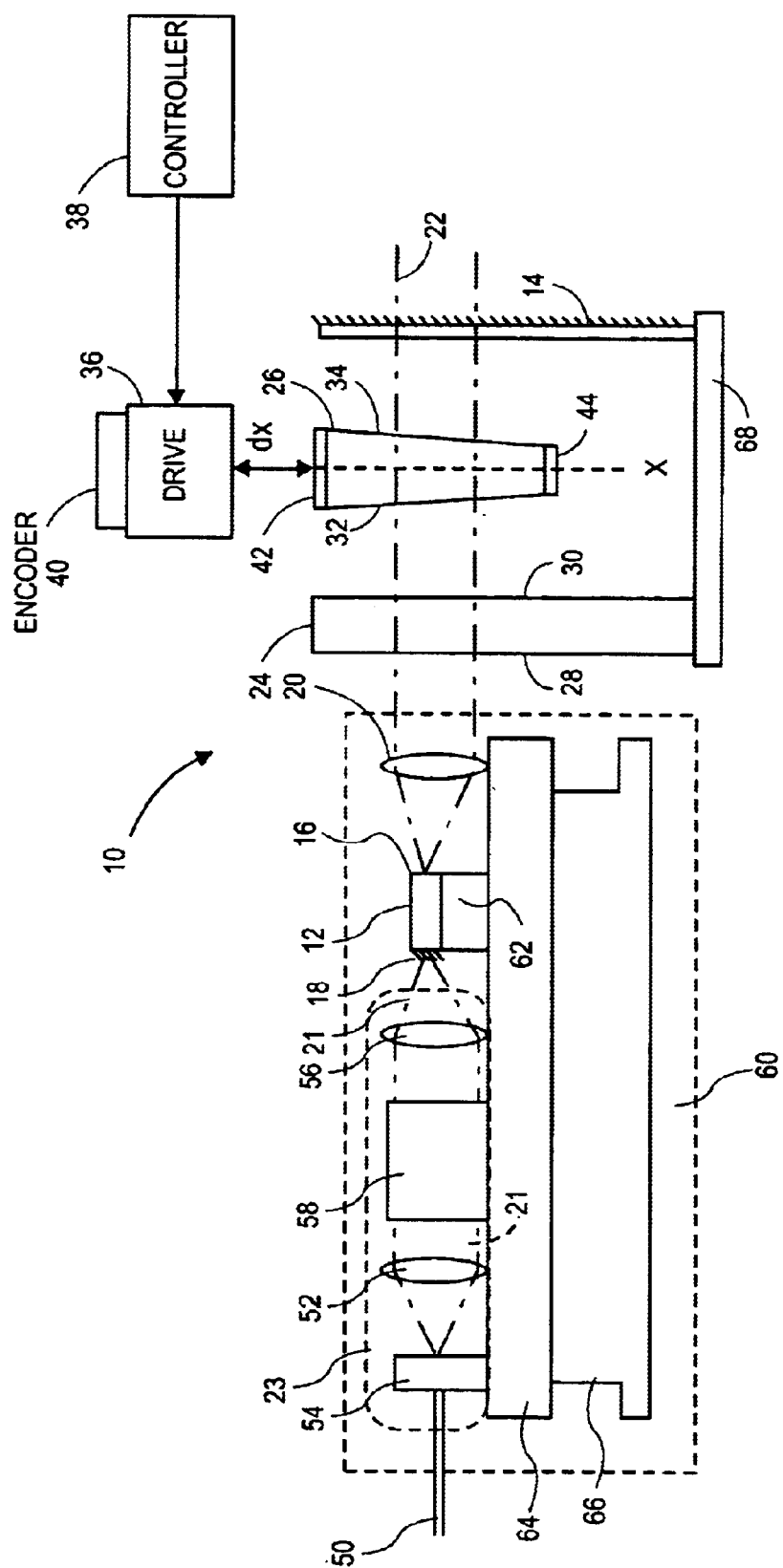
FIG. 1 is a schematic diagram of an external cavity laser apparatus with selective thermal control in accordance with the invention.

Referring to FIG. 1, there is shown external cavity laser apparatus 10 that provides selective thermal control of alignment-sensitive optical components in accordance with the invention. The apparatus 10 includes a gain medium 12 and an end reflector 14. Gain medium 12 may comprise a conventional Fabry-Perot diode emitter chip and has an anti-reflection (AR) coated front (first) facet 16 and a partially reflective rear (second) facet 18. Retroreflective element 14 may comprise an end mirror. The external laser cavity is delineated by rear facet 18 and end mirror 14. Gain medium 12 emits a coherent beam from front facet 16 that is collimated by lens 20 to define a first optical path 22 that is co-linear with the optical axis of the external cavity. The gain medium 12 also emits a second coherent beam from the second facet 18 to form a second optical path 21. Front and rear facets 16, 18 of gain medium 12 are aligned with the optical axis of the external cavity as well. The optical output assembly 23 is positioned in the second optical path 21 and associated with second output facet 18 for coupling the output of external cavity laser 10 into an optical fiber 50.

The external cavity laser 10 includes a grid etalon element and a tunable element, which are respectively shown in FIG. 1 as a grid etalon 26 and a wedge etalon 26 positioned in optical path 22 between gain medium 12 and end mirror 14. Grid etalon 24 typically is positioned in optical path 22 before tunable element 26, and has parallel reflective faces 28, 30. Grid etalon 24 operates as an interference filter, and the refractive index of grid etalon 24 and the optical thickness of grid etalon 24 as defined by the spacing of faces 28, 30 give rise to a multiplicity of minima within the communication band at wavelengths which coincide with the center wavelengths of a selected wavelength grid which may comprise, for example, the ITU (International Telecommunications Union) grid. Other wavelength grids may alternatively be selected. Grid etalon has a free spectral range (FSR) that corresponds to the spacing between the grid lines of the ITU grid, and the grid etalon 24 thus operates to provide a plurality of pass bands centered on each of the gridlines of the wavelength grid. Grid etalon 24 has a finesse (free spectral range divided by full width half maximum or FWHM) that suppresses neighboring modes of the external cavity laser between each channel of the wavelength grid.

Grid etalon 24 may be a parallel plate solid, liquid or gas spaced etalon or other type of etalon, and may be tuned by precise dimensioning of the optical thickness between faces 28, 30 by thermal expansion and contraction via temperature control. The grid etalon 24 may alternatively be tuned by tilting to vary the optical thickness between faces 28, 30, or by application of an electric field to an electrooptic etalon material. Grid etalon 24 also may be actively tuned during laser operation as described in the U.S. patent application Ser. No. 09/900,474 entitled "External Cavity Laser with Continuous Tuning of Grid Generator" to inventor Andrew Daiber, co-filed herewith, and incorporated herein by reference.

Wedge etalon 26 also acts as an interference filter, with non-parallel reflective faces 32, 34 providing tapered shape. The separation between surfaces 32 and 34 may be finely changed along the laser axis, by an amount less then or equal to the wavelength of operation, by extending surfaces 32 and 34 beyond the area where the beam strikes these surfaces and tapering the spacer between these surfaces such that the taper is small enough that the thickness change between 32 and 34 across the laser beam is negligible or tolerable and such that the taper is large enough that macroscopic motion of the filter across the beam introduces a microscopic change in the distance between 32 and 34 along the beam. The space between surfaces 32 and 34 may be gas filled, liquid filled, or filled with a solid. The space between surfaces 32 and 34 may be changed by thermally expanding a solid etalon, by thermally, piezoelectrically, or micromechanically expanding the spacing in a gas or liquid etalon, by tilting of a gas, solid, or liquid etalon, by changing the pressure of a gas etalon, by using an electrooptic material as a spacer and changing refractive index with an applied electric field, by using a nonlinear optical material in the spacer layer and inducing a path length change with second optical beam, or any other system or method suitable for wavelength tuning.

A wedge etalon channel selector 36 as shown in FIG. 1 is only one tunable element that may be used in accordance with the invention in an external cavity laser. Various other types of channel selector may be used with the invention. The use of an air gap wedge etalon for channel selection is described in U.S. Pat. No. 6,108,355, wherein the "wedge" is a tapered air gap defined by adjacent substrates. The use of pivotally adjustable grating devices as channel selectors tuned by grating angle adjustment and the use of an electrooptic tunable channel selector in an external cavity laser and tuned by selective application of voltage are described in U.S. patent application Ser. No. 09/814,646 to inventor Andrew Daiber and filed on Mar. 21, 2001. The use of a translationally tuned graded thin film interference filter as a channel selector is described in U.S. patent application Ser. No. 09/814,646 and in U.S. patent application Ser. No. 09/900,412 entitled "Graded Thin Film Wedge Interference Filter and Method of Use for Laser Tuning" to inventors Hopkins et al., co-filed herewith. The aforementioned disclosures are incorporated herein by reference.

The relative size, shape and distances between the various optical components of external cavity laser 10 are in some instances exaggerated for clarity and are not necessarily shown to scale. External cavity laser 10 may include additional components (not shown), such as focusing and collimating components, and polarizing optics configured to remove spurious feedback associated with the various components of external cavity laser 10.

The pass bands defined by the wedge etalon channel selector 26 are substantially broader than the pass bands of the grid etalon 24, with the broader pass bands of the wedge etalon 26 a periodicity substantially corresponding to the separation between the shortest and longest wavelength channels defined by the grid etalon 24. In other words, the free spectral range of the wedge etalon 26 corresponds to the full wavelength range of the wavelength grid defined by grid etalon 24. The wedge etalon 26 has a finesse that suppresses channels adjacent to a particular selected channel.

The wedge etalon 26 is used to select between multiple communication channels by changing the optical thickness between faces 32, 34 of wedge etalon 26. This is achieved by translating or driving wedge etalon 26 along axis x, which is parallel to the direction of taper of wedge etalon 26 and perpendicular to optical path 22 and the optical axis of external cavity laser 10. Each of the pass bands defined by the wedge etalon 26 supports a selectable channel, and as the wedge is advanced or translated into optical path 22, the beam traveling along optical path 22 passes through increasingly thicker portions of wedge etalon 26 which support constructive interference between opposing faces 32, 34 at longer wavelength channels. As wedge etalon 26 is withdrawn from optical path 22, the beam will experience increasingly thinner portions of wedge etalon 26 and expose pass bands to the optical path 22 that support correspondingly shorter wavelength channels. The free spectral range of wedge etalon 26 corresponds to the complete wavelength range of grid etalon 24 as noted above, so that a single loss minimum within the communications band can be tuned across the wavelength grid. The combined feedback to gain medium 12 from the grid etalon 24 and wedge etalon 26 support lasing at the center wavelength of a selected channel. Across the tuning range, the free spectral range of the wedge etalon 26 is broader than that of grid etalon 24.

Wedge etalon 26 is positionally tuned via a tuning assembly that comprises a drive element 36 structured and configured to adjustably position wedge etalon 26 according to selected channels. Drive element 36 may comprise a stepper motor together with suitable hardware for precision translation of wedge etalon 26. Drive element may alternatively comprise various types of actuators, including, but not limited to, DC servomotors, solenoids, voice coil actuators, piezoelectric actuators, ultrasonic drivers, shape memory devices, and like linear actuators.

Drive element 36 is operatively coupled to a controller 38 that provides signals to control the positioning of wedge etalon 26 by drive element 36. Controller 38 may include a data processor and memory (not shown) wherein are stored lookup tables of positional information for wedge etalon 26 that correspond to selectable channel wavelengths. Controller 38 may be internal to driver element 36, or may be external and shared in other component positioning and servo functions of the invention as described below.

When external cavity laser 10 is tuned to a different communication channel, controller 38 signals drive element 36 according to positional data in the look up table, and drive element 36 translates or drives wedge etalon 26 to the correct position wherein the optical thickness of the portion of the wedge etalon 26 positioned in optical path 22 provides constructive interference which supports the selected channel. A linear encoder 40 may be used in association with wedge etalon 26 and drive element 36 to ensure correct positioning of wedge etalon 26 by driver 36.

Wedge etalon 26 may include opaque regions 42, 44 at its ends that are optically detectable and which serve to verify the position of wedge etalon 26 when it has been positionally tuned to its longest or shortest channel wavelength. Opaque regions 26 provide an additional encoder mechanism usable in the positional tuning of wedge etalon. When wedge 26 is moved into a position such that one of opaque regions 42, 44 enters optical path 22, the opaque region 42, 44 will block or attenuate the beam along optical path. This attenuation of light is detectable, as described further below. Since the location of opaque regions 42, 44 on wedge etalon 26 can be determined with precision, controller 38 can anticipate when an opaque region 42, 44 will enter optical path 22. Appearance of an opaque region 42, 4 in optical path 22 at a point other than predicted will indicate an encoder error, and the controller 38 can make an appropriate correction based on the detected presence of an opaque region 42, 44 in optical path 22. Additional opaque regions (not shown) may be included elsewhere on wedge etalon 26.

The pass band relationship of the grid etalon 24, wedge etalon 26 and the external cavity defined by rear facet 18 and end mirror 14 are illustrated graphically in FIG. 2A through FIG. 2C, which show external cavity pass bands PB1, grid etalon pass bands PB2, and wedge etalon pass bands PB3. Relative gain is shown on the vertical axis and wavelength on the horizontal axis. As can be seen, free spectral range of the wedge etalon 26 ($FSR_{Channel\ Sel}$) is greater than the free spectral range of the grid etalon 24 ($FSR_{Grid\ Gen}$), which in turn is greater than the free spectral range of the external cavity ($FSR_{Cavity}$). The band pass peaks PB1 of the external cavity periodically align with the center wavelengths of pass bands PB2 defined by the wavelength grid of grid etalon 24. There is one pass band peak PB3 from the wedge etalon 26 that extends over all of the pass bands PB2 of the wavelength grid. In the specific example shown in FIGS. 2A–2C, the wavelength grid extends over sixty four channels spaced apart by one half nanometer (nm) or 62 GHz, with the shortest wavelength channel at 1532 nm, and the longest wavelength channel at 1563.5 nm.

The finesse of grid etalon 24 and wedge etalon 26 determine the attenuation of neighboring modes or channels. As noted above, finesse is equal to the free spectral range over the full width half maximum, or finesse=FSR/FWHM. The width for a grid etalon pass band PB2 at half maximum is shown in FIG. 2B, and the width for a wedge etalon pass band PB3 at half maximum is shown in FIG. 2C. The positioning of grid etalon 24 and wedge etalon 26 within the external cavity improves side mode suppression.

Figure 3A:
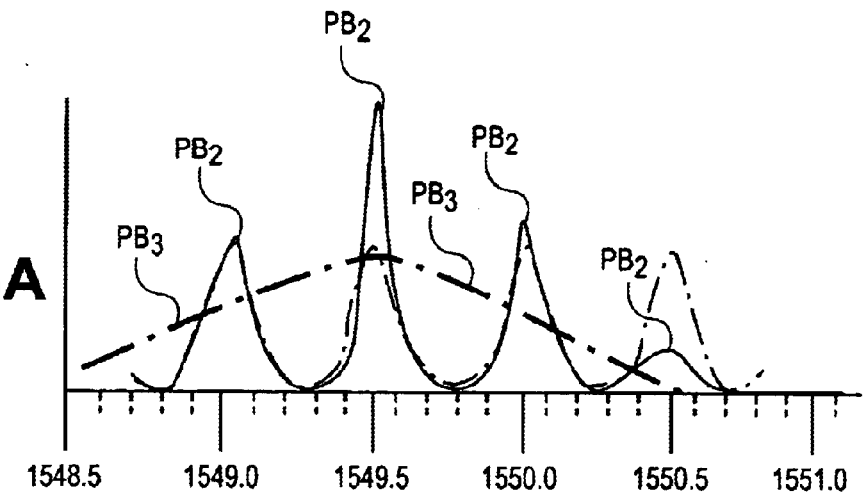
FIGS. 3A–3C are graphical illustrations of gain response to tuning of the external cavity laser of FIG. 1 for a plurality of channels in a wavelength grid.
Figure 3B:
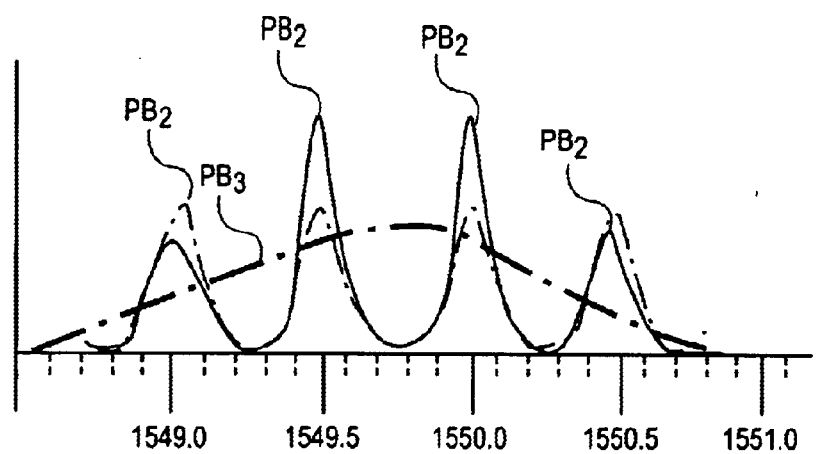
Figure 3C:
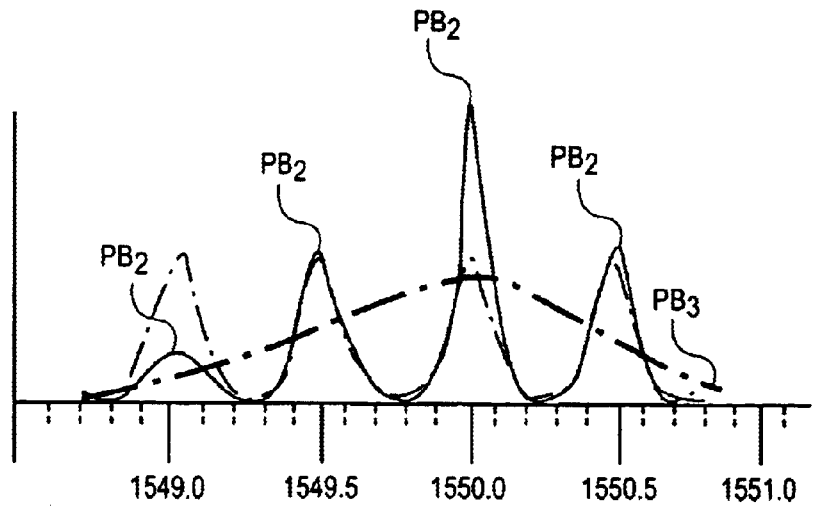

The tuning of the band pass PB3 of wedge etalon 26 between a channel centered at 1549.5 nm and an adjacent channel at 1550 nm is illustrated graphically in FIGS. 3A–3C, wherein the selection of a channel generated by grid etalon 24 and the attenuation of adjacent channels or modes is shown. The external cavity pass bands PB1 shown in FIGS. 2A–2C are omitted from FIGS. 3A–3C for clarity. The grid etalon 24 selects periodic longitudinal modes of the external cavity corresponding to the grid channel spacing while rejecting neighboring modes. The wedge etalon 26 selects a particular channel in the wavelength grid and rejects all other channels. The selected channel or lasing mode is stationary at one particular channel for filter offsets in the range of approximately plus or minus one half channel spacing. For larger channel offsets the lasing mode jumps to the next adjacent channel.

In FIG. 3A, the wedge etalon pass band PB3 is centered with respect to the grid channel at 1549.5 nm. The relative gain associated with pass band PB2 at 1549.5 nm is high, while the relative gain levels associated with adjacent pass bands PB2 at 1549.0 nm and 1550.0 nm are suppressed relative to the selected 1549.5 nm channel. The gain associated with pass bands PB2 at 1550.5 nm and 1548.5 nm is further suppressed. The dashed line indicates the relative gain for pass bands PB2 without suppression by wedge etalon 26.

FIG. 3B shows the wedge etalon pass band PB at a position in between the channels at 1549.5 nm and 1550.0 nm, as occurs during channel switching. The relative gain associated with pass bands PB2 at 1549.5 nm and 1550.0 are both high, with neither channel suppressed. The relative gain levels associated with pass bands PB2 at 1549.0 nm and 1550.5 nm are suppressed relative to the 1549.5 nm and 1550.0 nm channels. The dashed line indicates the relative gain for pass bands PB2 without suppression by wedge etalon 26.

FIG. 3C shows the wedge etalon pass band PB3 centered with respect to the grid channel at 1550.0 nm, with the relative gain associated with the pass band PB2 at 1550.0 nm being high, while the relative gain levels associated with adjacent pass bands PB2 at 1549.5 nm and 1550.5 nm are suppressed relative to the selected 1550.0 nm channel, and the gain associated with pass bands PB2 at 1551.0 nm and 1549.0 nm is further suppressed. Again, the dashed line indicates the relative gain for pass bands PB2 without suppression by wedge etalon 26.

The optical output assembly 23 is configured to optically couple the output from gain medium facet 18 into an optical fiber 50. In this regard, the output assembly 23 includes a fiber focusing lens 52 positioned in the second optical path 46 and optically coupled to optical fiber 50 by fiber ferrule 54. A second collimating lens 56 is optically coupled to output facet 18 and positioned in the second optical path 46 between the second output facet 18 and the fiber focusing lens 52. An optical isolator 58 is positioned after the second collimating lens 56 and before the fiber focusing lens 52 within second optical path 46.

In the embodiment shown in FIG. 1, the optical output assembly 23, gain medium 12 and first collimating lens 20 are portions of a thermal control module 60. In the thermal control module 60, optical output assembly 23, gain medium 12, collimating lens 20, and a "dog bone" mounting element 62 are all mounted on a thermally conductive substrate 64. Substrate 64 is joined to or mounted on a thermoelectric controller 66 that is configured to thermally control the module 60 independently, or substantially independently, of other components in external cavity laser 10. Grid etalon 24 and end mirror 14 are shown in FIG. 1 as being positioned remotely from substrate 64, and mounted on a different substrate 68. The use of thermal control on selected optical components as provided by module 60 reduces the power requirements for operation of the apparatus 10 by selectively heating only important alignment-sensitive optical components and optical surfaces.

Gain medium 12 (and facets 16, 18) and the surfaces of collimating lenses 20, 56 and fiber focusing lens 52, represent many of the important, alignment-sensitive optical surfaces of the apparatus 10, and the gain medium 12 and lenses 20, 52, 56 are included in thermal control module 60 and mounted on temperature controlled substrate 64 to allow accurate thermal control of these elements without unnecessarily applying thermal control elsewhere in the apparatus 10. The end mirror 14 grid etalon 24, being positioned on substrate 68, are thermally isolated, or substantially thermally isolated, from thermally conductive substrate 64 in thermal control module 60, such that thermal control of gain medium 12, collimator 20 and output assembly 23 via thermally conductive substrate does not involve direct, intentional thermal control of end mirror 14 or grid etalon. The tuning assembly provided by drive element 36 and encoder 40 may be mounted on substrate 68 and thus thermally isolated with respect to substrate 64. Controller 38 may likewise be mounted on substrate 68.

In some embodiments it is desirable to separately provide thermal control to grid etalon 24 by a separate thermoelectric controller (not shown). In other embodiments, grid etalon 24 may be included on thermally conductive substrate 64 as described further below. It is contemplated that heating or cooling of module 60 may, in some instances, result in indirect thermalization of other portions of laser apparatus 10 by radiative heat transfer or unintended thermal conduction via a common underlying base (not shown) which supports substrate 68 and thermoelectric controller 66.

Figure 4:
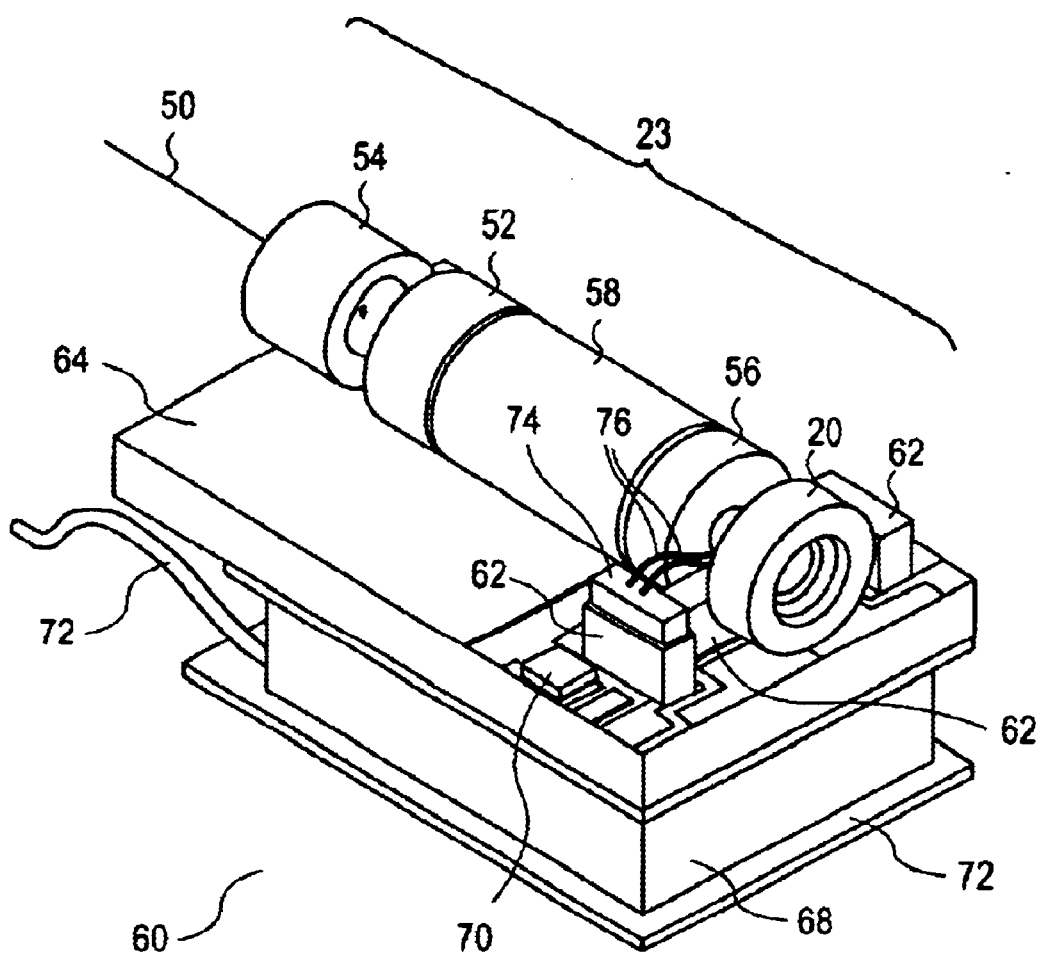
FIG. 4 is a perspective view of a thermal control module in accordance to the invention.
Figure 5:
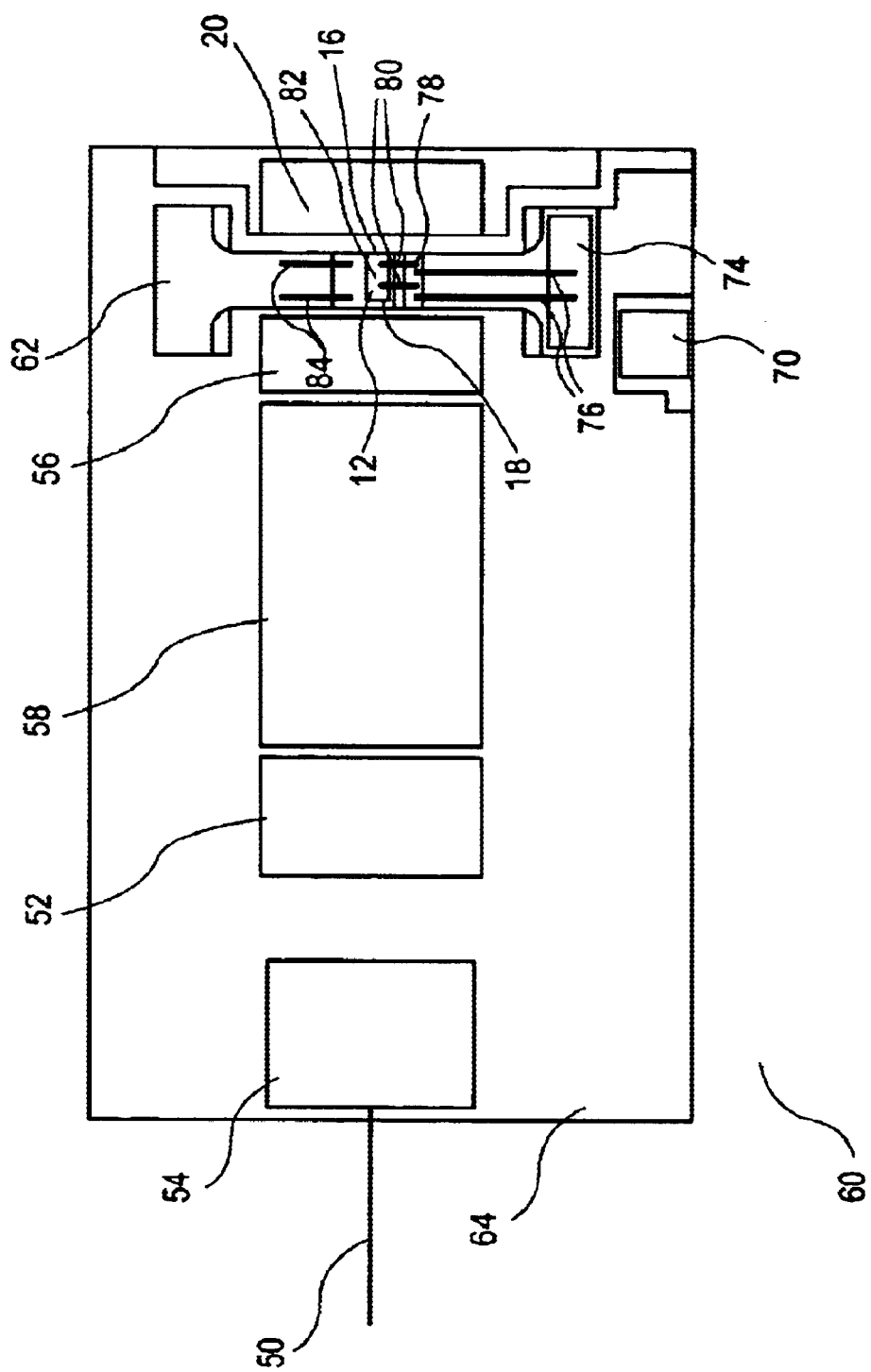
FIG. 5 is a top plan view of the thermal control module of FIG. 4

Referring more particularly to FIG. 4 and FIG. 5, it can be seen that the thermal control module 60 allows for the placement of laser output elements on a substrate 64, which is distinct and separate from substrate 68 or substrates supporting the other external cavity laser components. Thermal control module 60 comprises a diode emitter chip (gain medium) 12 with output facets 16, 18 with collimator lenses 20, 56 optically coupled to facets 16, 18 respectively, a thermally conductive dog bone assembly 62, a thermistor 70, an optical isolator 58, a fiber focus lens 52 and a fiber ferrule 54, mounted on the laser optical output assembly substrate 68. FIG. 4 also shows an electrical lead 72 for providing power to module 60.

The substrate 64 of module 60 is bonded to a thermoelectric controller 66 which monitors the temperature of substrate 64 via thermistor 70 and provides thermal control of substrate 64 and the gain medium, collimators 20, 56, fiber focusing lens 52, ferrule 54 and isolator 58 components thereon. Gain medium facets 16 and 18, as well as the surfaces of collimators 20, 56 and lens 52, present several of the more important alignment-sensitive optical surfaces of the laser apparatus 10, and the inclusion of all of these components onto a single thermally controlled substrate 64 allows collective temperature control of the components to prevent optical alignment problems due to thermal misregistration.

Substrate 64 and dog bone mount 62 ideally comprise a material of high thermal conductivity such a metal, metal oxide, metal nitride, metal carbide, or alloys, blends, mixtures or composites thereof. In certain embodiments the substrate 64 and mount element 62 comprise aluminum nitride, silicon carbide, or a silicon carbide blend (alloy). Mount element 62 and substrate 64 are configured such that gain medium 12 is thermally coupled to substrate 64 through mount element 62. The substrate 64 and mounting element 62 may be matched in CTE (coefficient of thermal expansion) to that of gain medium 12.

The fiber ferrule 54, lenses 20, 52, 56, optical isolator 58 and mounting element 62 preferably are mounted or joined to substrate 64 by a thermally conductive adhesive or solder which may be CTE-matched to each particular component. Gain medium 12 is joined to mount 62 in a similar manner with a thermally conductive adhesive or solder that may be CTE-matched to gain medium 12 and mounting element 62. Mounting element 62, fiber ferrule 54, lenses 20, 52, 56 may be structured and configured in a manner which promotes thermal contact with substrate 64. In this regard, lenses 20, 52, 56 may be housed in suitable thermally conductive housings to promote thermal contact with substrate 64. Substrate 64 may likewise include grooves, recesses or other surface feature (not shown) configured to optimize thermal contact with the aforementioned components. Various other thermal control considerations known to those skilled in the art may be used in the mounting of element 62, fiber ferrule 54, and lenses 20, 52, 56 to substrate 64, for coupling substrate 64 to thermoelectric controller 68, and for coupling thermistor 70 to substrate 64 and thermoelectric controller 68.

Referring more particularly to FIG. 5, a bonding pad 74 is included on one end of dog bone mounting element 62, which supports electrical conductors 76. Conductors 76 couple to a second bonding pad 78 on mount 62. Conductors 80 from bonding pad 78 couple to an electrode 82 on the top surface of gain medium 12. Conductors 84 couple to an electrode (not shown) on the bottom surface of gain medium, to allow delivery of a drive current to gain medium 12 in a conventional manner.

Referring again to FIG. 1 as well as FIG. 4 and FIG. 5, in the operation of the laser apparatus 10, a drive current is applied across gain medium 12, which emits a coherent beam from anti-reflection coated facet 16 along path 22 to end mirror 14, which provides optical feedback to gain medium 12, which outputs another coherent beam through output assembly 23 and into fiber 50. Wedge etalon 26 may be moved with respect to optical path 22 to tune the laser output in the manner described above. During the pumping of gain medium, thermoelectric controller 66 cools substrate 64 to counteract the heat generated by gain medium 12 during operation. Since gain medium 12, collimator 20 and output assembly 23 are thermally coupled to thermoelectric controller 68 via substrate 64, gain medium 12, collimator 20 and output assembly 23 at a constant or substantially constant temperature, thereby preventing mis-alignment or mis-registration of the components coupled to substrate 64 due to thermal fluctuation. Cooling of gain medium 12 during laser operation via substrate 64 and thermoelectric controller 44 also helps avoid thermal degradation and aging of the anti-reflection coating (not shown) on output facet 16.

When external cavity laser 10 is not in use, gain medium 12, collimator 20 and output assembly 23 can again be maintained at a constant temperature by thermoelectric controller 66 and substrate 64 so that the various optical surfaces on module 60 are at a higher temperature than the surrounding portions of external cavity laser. The maintenance of a higher temperature for the components on module 60 during power-down periods helps avoid condensation of moisture or volatile organic compounds on the important optical surfaces in module which may otherwise occur is the components of module are allowed to cool down. The use of selective heating of selected optical components of an external cavity laser in a hermetically sealed container is described in U.S. patent application Ser. No. 09/900,423 entitled "Hermetically Sealed External Cavity Laser Apparatus" to inventors Sell et al., filed concurrently herewith and incorporated herein by reference.

Figure 6:
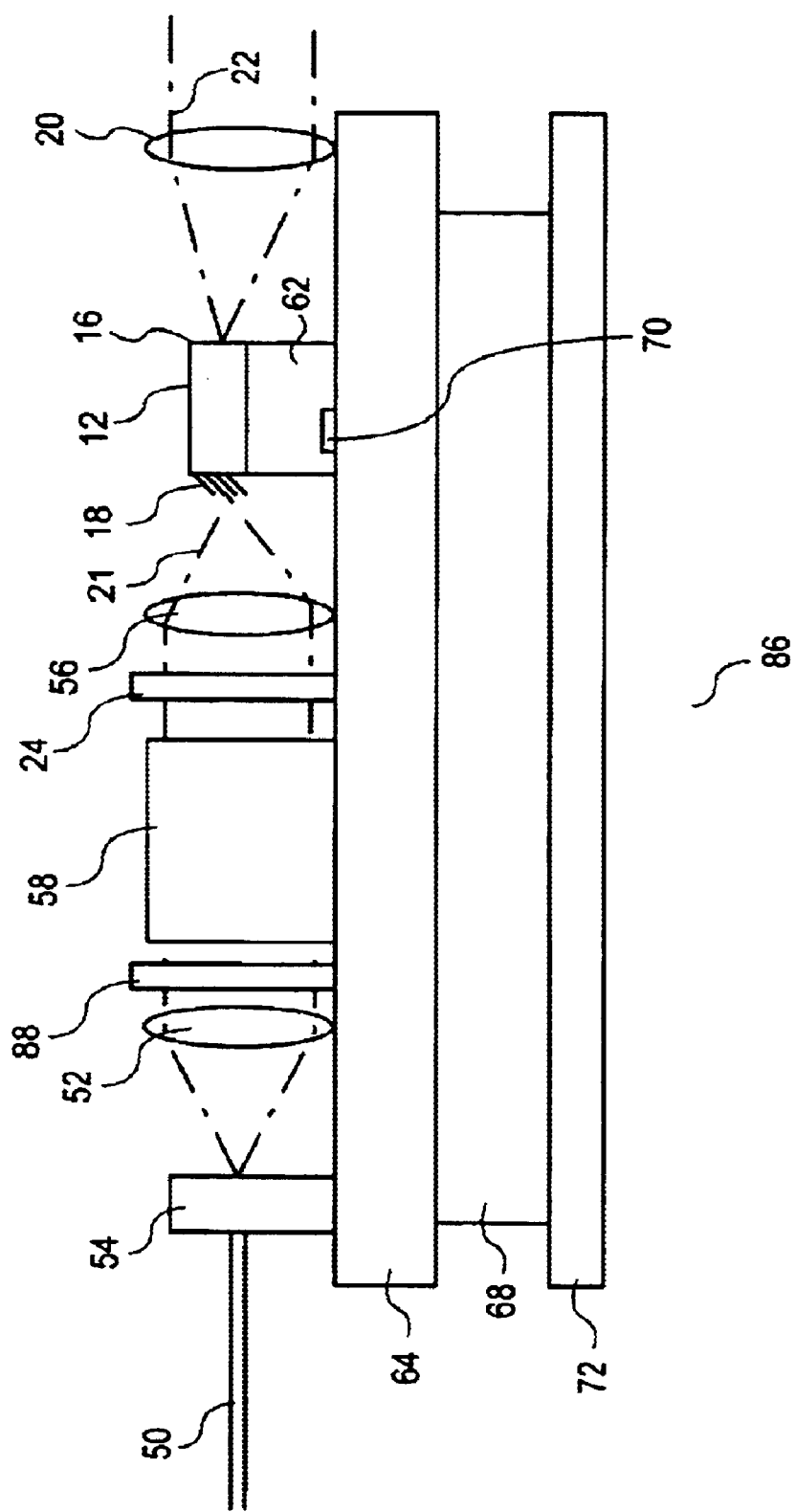
FIG. 6 is a schematic diagram of an alternative embodiment thermal control module in an external cavity laser.

Various other optical components may be subject to selective thermal control by mounting onto substrate 64 or an additional thermally controlled substrate in accordance with the invention. FIG. 6 is a schematic diagram of an alternative embodiment optical thermal control module 86, wherein like reference numbers are used to denote like parts. In the embodiment of FIG. 6, a grid etalon 24 is mounted on substrate 64 instead of being positioned elsewhere in the laser external cavity, and is thermally coupled to thermoelectric controller 66 through substrate 64. Grid etalon 24 may be positioned in the second optical path 21 after second collimating lens 56 and before optical isolator 58 as shown, or after optical isolator 58 and before fiber focus lens 54. Thermal control of grid etalon 24 at a fixed, selected temperature by thermally conductive substrate 64 and thermoelectric controller 66 keeps the frequency grid of grid etalon constant, as well as maintains optimal alignment of the faces of grid etalon 24 with respect to optical path 21. Grid etalon 24 may alternatively be positioned elsewhere, such as in first optical path 22 as shown in FIG. 1, and subject to separate thermal control, as noted above.

The thermal control module 86 of FIG. 6 also includes a coarse spectrometer 88 mounted on thermally conductive substrate 64 and thermally coupled to thermoelectric controller 66 through substrate 64. The coarse spectrometer 88 is used embodiments of the invention wherein wavelength characterization of the optical output to fiber 50 is desired, such as in external cavity lasers used for test and measurement purposes. Coarse spectrometer 88 is mounted on thermally conductive substrate 64 and positioned in optical path 21 after isolator 58 and before fiber focus lens 52. Coarse spectrometer could alternatively be positioned in optical path 21 after collimating lens 56 and before isolator 58.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

That which is claimed is:

1. A laser apparatus comprising:
   a gain medium having first and second output facets;
   a reflector, said reflector and said second output facet defining an external cavity;
   an optical output assembly optically coupled to said second output facet;
   a first thermally conductive substrate, said gain medium and said optical output assembly mounted on said first thermally conductive substrate;
   a thermoelectric controller joined to said first thermally conductive substrate, said gain medium and said optical output assembly configured to be thermally controlled by said thermoelectric controller via thermal conduction through said first substrate; and
   said reflector mounted on a second substrate, said second substrate thermally isolated from said first thermally conductive substrate and thermally controlled independently from said first thermally conductive substrate.

2. The laser apparatus of claim 1, wherein said first thermally conductive substrate has a coefficient of thermal expansion matched to that of said gain medium.

3. The laser apparatus claim 1, further comprising:
   a channel selector;
   a tuning assembly operatively coupled to said channel selector and configured to adjust said channel selector; and
   said channel selector and said tuning assembly positioned remotely from said first thermally conductive substrate.

4. The laser apparatus of claim 1, further comprising a first collimating lens optically coupled to said first output facet, said first collimating lens mounted on said first thermally conductive substrate and configured to be thermally controlled by said thermoelectrical controller by thermal conduction through said first thermally conductive substrate.

5. The laser apparatus of claim 1, wherein said output assembly comprises a second collimating lens optically coupled to said second output facet.

6. The laser apparatus of claim 4, wherein said optical output assembly further comprises and optical isolator, said optical isolator optically coupled to said second collimating lens.

7. The laser apparatus of claim 4, wherein said optical output assembly further comprises a fiber focus lens, said fiber focus lens optically coupled to said optical isolator and to an optical fiber.

8. The laser apparatus of claim 1, further comprising a thermistor operatively coupled to said first thermally conductive substrate and said thermoelectrical controller.

9. The laser apparatus of claim 1, further comprising a grid etalon, said grid etalon mounted on said first thermally conductive substrate.

10. The laser apparatus of claim 4, wherein said optical output assembly further comprises a coarse spectrometer, said course spectrometer mounted on said first thermally conductive substrate.

11. The laser apparatus of claim 1, wherein said gain medium, said optical output assembly, said first thermally conductive substrate and said thermoelectric controller are hermetically sealed in an inert atmosphere.

12. The laser apparatus of claim 1, wherein said first thermally conductive substrate comprises a material selected from aluminum nitride, silicon carbide, and a silicon carbide/aluminum nitride alloy.

13. The external cavity laser apparatus of claim 3, wherein, said channel selector and said tuning assembly are mounted on said second substrate.

14. An external cavity laser apparatus comprising:
a gain medium having first and second output facets, said gain medium to emit a first coherent beam from said first output facet along a first optical path and a second coherent beam from said second output facet along a second optical path;
an end mirror positioned in said first optical path, said end mirror and said second output facet defining an external cavity;
an optical output assembly positioned in said second optical path;
a first thermally conductive substrate, said gain medium and said optical output assembly mounted on said first thermally conductive substrate;
a thermoelectric controller joined to said first thermally conductive substrate, said gain medium and said optical output assembly thermally coupled to said thermoelectric controller by said first thermally conductive substrate;
said end mirror mounted on a second substrate, said second substrate thermally isolated from said first thermally conductive substrate and thermally controlled independently from said first thermally conductive substrate; and
a grid etalon mounted on said second substrate and positioned in said first optical path between said first output facet and said end mirror.

15. The external cavity laser apparatus of claim 14, wherein said first thermally conductive substrate has a coefficient of thermal expansion matched to that of said gain medium.

16. The external cavity laser apparatus of claim 14, further comprising:
a channel selector positioned in said first optical path between said first output facet and said end mirror;
a tuning assembly operatively coupled to said channel selector and configured to adjust said channel selector; and
said channel selector and said tuning assembly thermally isolated from said first thermally conductive substrate and said thermoelectric controller.

17. The external cavity laser apparatus of claim 16, wherein:
said channel selector comprises a wedge etalon; and
said tuning assembly comprises a stepper motor configured to positionally adjust said wedge etalon in said first optical path.

18. The external cavity laser of claim 17, wherein said tuning assembly further comprises an optical encoder configured to monitor positioning of said stepper motor and said wedge etalon.

19. The external cavity laser apparatus of claim 14, further comprising a first collimating lens positioned in said first optical path proximate to said first output facet, said first collimating lens mounted on said first thermally conductive substrate and thermally coupled to said thermoelectric controller through said first thermally conductive substrate.

20. The external cavity laser apparatus of claim 14, wherein said optical output assembly comprises:
a fiber focusing lens positioned in said second optical path and optically coupled to a fiber;
a second collimating lens positioned in said second optical path between said second output facet and said fiber focusing lens; and
an optical isolator positioned in said second optical path after said second collimating lens and before said fiber focusing lens.

21. The external cavity laser apparatus of claim 20, further comprising a grid etalon mounted on said first thermally conductive substrate and thermally coupled to said thermoelectric controller, said grid etalon positioned in said second optical path after said second collimating lens.

22. The external cavity laser apparatus of claim 20, further comprising a coarse spectrometer mounted on said first thermally conductive substrate and thermally coupled to said thermoelectric controller, said coarse spectrometer positioned in said second optical path after said second collimating lens.

23. An external cavity laser apparatus comprising:
a gain medium having first and second output facets, said gain medium emitting a first coherent beam from said first output facet along a first optical path and a second coherent beam from said second output facet along a second optical path;
an end mirror positioned in said first optical path, said end mirror and said second output facet defining an external cavity;
an optical output assembly positioned in said second optical path;
a first thermally conductive substrate, said gain medium and said optical output assembly mounted on said first thermally conductive substrate;
a first thermoelectric controller joined to said first thermally conductive substrate, said gain medium and said optical output assembly thermally coupled to said first thermoelectric controller by said first thermally conductive substrate; and
said end mirror mounted on a second substrate thermally isolated from said first thermally conductive substrate and thermally controlled by a second thermoelectric controller coupled to said second substrate.

24. The external cavity laser apparatus of claim 23, further comprising:
a channel selector positioned in said first optical path between said first output facet and said end mirror;
a tuning assembly operatively coupled to said channel selector and configured to adjust said channel selector; and
said channel selector and said tuning assembly positioned to allow said first thermoelectric controller to thermally control said gain medium and said optical output assembly independently from said channel selector and said tuning assembly.

25. A laser apparatus comprising:
a gain medium having first and second output facets;
an end mirror optically coupled said first output facet;

an optical output assembly optically coupled to said second output facet;

a first substrate, said first substrate being thermally conductive, said gain medium and said optical output assembly mounted on said first substrate;

a thermoelectric controller joined to said first substrate, said gain medium and said optical output assembly configured to be thermally controlled by said thermoelectric controller via thermal conduction through said first substrate; and a second substrate, said end mirror positioned on said second substrate and thermally controlled independently from said first substrate.

26. A laser apparatus, comprising:

a gain medium;

a reflector, said reflector and an output facet of said gain medium defining a laser cavity;

an optical output assembly optically coupled to said gain medium, the optical output assembly to optically couple an optical signal from the output facet of the gain medium to an optical fiber, the optical output assembly comprising:
- a collimating lens optically coupled to said output facet of said gain medium; and
- a fiber focus lens optically coupled between said collimating lens and said optical fiber; and means for providing selective thermal control to said optical output assembly independently from said reflector.

27. The laser apparatus of claim 26, further comprising means for providing selective thermal control to said gain medium independently from said reflector.

28. The laser apparatus of claim 26, wherein said means for providing selective thermal control to said optical output assembly comprises:

a thermally conductive substrate, said optical output assembly mounted on said thermally conductive substrate; and a thermoelectric controller joined to said thermally conductive substrate, said optical output assembly configured to be thermally controlled by said thermoelectric controller via thermal conduction through said substrate.

29. The laser apparatus of claim 27, wherein said means for providing selective thermal control to said gain medium comprises:

a thermally conductive substrate, said gain medium mounted on said thermally conductive substrate; and a thermoelectric controller joined to said thermally conductive substrate, said gain medium configured to be thermally controlled by said thermoelectric controller via thermal conduction through said thermally conductive substrate.

* * * * *

UNITED STATES PATENT AND TRADEMARK OFFICE
CERTIFICATE OF CORRECTION

PATENT NO. : 6,724,797 B2
DATED : April 20, 2004
INVENTOR(S) : Daiber

It is certified that error appears in the above-identified patent and that said Letters Patent is hereby corrected as shown below:

Column 12,
Line 38, insert -- of -- after the word "apparatus".

Signed and Sealed this

Twenty-seventh Day of July, 2004

JON W. DUDAS
*Acting Director of the United States Patent and Trademark Office*